(12) United States Patent
Kidoh

(10) Patent No.: US 8,723,621 B2
(45) Date of Patent: May 13, 2014

(54) ELASTIC WAVE DEVICE HAVING PAIRS OF FILTERS THAT FACE EACH OTHER

(75) Inventor: Hideo Kidoh, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 97 days.

(21) Appl. No.: 13/570,273

(22) Filed: Aug. 9, 2012

(65) Prior Publication Data

US 2012/0306593 A1    Dec. 6, 2012

Related U.S. Application Data

(63) Continuation of application No. PCT/JP2010/072222, filed on Dec. 10, 2010.

(30) Foreign Application Priority Data

Feb. 17, 2010    (JP) .................................. 2010-032921

(51) Int. Cl.
  *H03H 9/70* (2006.01)
  *H03H 9/72* (2006.01)
  *H04B 1/50* (2006.01)

(52) U.S. Cl.
  USPC ............. 333/133; 333/193; 333/189; 455/82; 455/83

(58) Field of Classification Search
  USPC ................ 333/133, 187–196; 455/78, 82, 83
  See application file for complete search history.

(56) References Cited

U.S. PATENT DOCUMENTS

| | | | | |
|---|---|---|---|---|
| 4,295,102 A | * | 10/1981 | Schmidt et al. | 331/65 |
| 4,622,855 A | * | 11/1986 | Sinha et al. | 73/703 |
| 7,289,008 B2 | * | 10/2007 | Kuroki et al. | 333/133 |
| 7,511,595 B2 | * | 3/2009 | Park et al. | 333/133 |
| 7,863,699 B2 | * | 1/2011 | Dropmann et al. | 257/416 |
| 8,294,535 B2 | * | 10/2012 | Feiertag et al. | 333/187 |
| 2002/0109564 A1 | * | 8/2002 | Tsai et al. | 333/187 |
| 2002/0158707 A1 | | 10/2002 | Noguchi | |
| 2006/0065714 A1 | | 3/2006 | Jesme | |

(Continued)

FOREIGN PATENT DOCUMENTS

JP    05-304436 A    11/1993
JP    2001-345673 A    12/2001

(Continued)

OTHER PUBLICATIONS

Official Communication issued in International Patent Application No. PCT/JP2010/072222, mailed on Feb. 22, 2011.

*Primary Examiner* — Barbara Summons
(74) *Attorney, Agent, or Firm* — Keating & Bennett, LLP

(57) ABSTRACT

In an elastic wave device, a first piezoelectric substrate and a second piezoelectric substrate are joined to each other with a joining portion so as to face each other across a cavity. A first set of a plurality of filters located on a facing surface of the first piezoelectric substrate and a second set of a plurality of filters located on a facing surface of the second piezoelectric substrate define a plurality of pairs of filters and face each other across the cavity. An absolute value of a difference between center frequencies of a filter of the first set of filters and a filter of the second set of filters in each pair of filters is larger than a minimum value among absolute values of differences between center frequencies of pairs of filters selected from a group including the first set of filters and the second set of filters.

6 Claims, 2 Drawing Sheets

(56) References Cited

U.S. PATENT DOCUMENTS

| | | |
|---|---|---|
| 2007/0012655 A1* | 1/2007 | Kwon et al. .................... 216/13 |
| 2007/0115079 A1 | 5/2007 | Kubo et al. |
| 2009/0224851 A1* | 9/2009 | Feiertag et al. ............... 333/186 |
| 2009/0224852 A1 | 9/2009 | Shibahara |

FOREIGN PATENT DOCUMENTS

| | | | |
|---|---|---|---|
| JP | 2002-043890 A | | 2/2002 |
| JP | 2002-330057 A | | 11/2002 |
| JP | 2004-297633 A | | 10/2004 |
| JP | 2006-186747 A | | 7/2006 |
| JP | 2006-203652 | * | 8/2006 |
| JP | 2007-060465 A | | 3/2007 |
| JP | 2008-113178 A | | 5/2008 |
| JP | 2008-515086 A | | 5/2008 |
| JP | 2008-546207 A | | 12/2008 |
| WO | 2006/008940 A1 | | 1/2006 |

\* cited by examiner

ELASTIC WAVE DEVICE HAVING PAIRS OF FILTERS THAT FACE EACH OTHER

BACKGROUND OF THE INVENTION

1. Field of the Invention

The present invention relates to elastic wave devices and specifically relates to elastic wave devices such as multi-band filters and duplexers that include piezoelectric substrates that face each other across a cavity.

2. Description of the Related Art

For example, as illustrated in the sectional view of FIG. 4, an elastic wave device (dual filter) has been proposed in which a cavity 118 is formed between piezoelectric substrates 112 and 114 by being joined to each other via an intermediate layer 113. The piezoelectric substrates 112 and 114, on which comb-shaped interdigital transducer (IDT) electrodes 121 and 123, which are for exciting surface acoustic waves, are formed, such that the surfaces on which the electrodes are formed face each other (See, for example, Japanese Unexamined Patent Application Publication No. 2008-546207).

In the case where a configuration in which piezoelectric substrates face each other across a cavity in this way is applied to a surface acoustic wave duplexer (SAW-DPX), forming a transmission (Tx) filter on one of the piezoelectric substrates and forming a reception (Rx) filter on the other of the piezoelectric substrates and then arranging the piezoelectric substrates such that the surface on which the Tx filter has been formed and the surface on which the Rx filter has been formed face each other has been considered. If such a configuration is adopted, a reduction in size can be achieved compared with a configuration in which both a Tx filter and an Rx filter are formed on one surface of a single piezoelectric substrate.

However, if a Tx filter and an Rx filter face each other with a small cavity therebetween, their isolation is degraded due to electromagnetic coupling therebetween. In order to improve upon this point, for example, as illustrated in the sectional view of FIG. 3, it is necessary that a Tx filter 21 and an Rx filter 23 respectively formed on piezoelectric substrates 12 and 14 be arranged in a staggered manner so as not to face each other across a cavity 18 formed between the piezoelectric substrates 12 and 14, which are connected to each other via a joining portion 13. However, if the positions of the Tx filter 21 and the Rx filter 23 are staggered in this way, the advantage of a reduction in size obtained with a configuration in which the two piezoelectric substrates 12 and 14 face each other across the cavity 18 is lessened.

Accordingly, in the case where a configuration in which piezoelectric substrates face each other across a cavity is applied to a SAW-DPX, it is difficult to both secure isolation characteristics and achieve a reduction in size.

In addition, when a configuration in which piezoelectric substrates face each other across a cavity is applied to a dual filter, in the case where the center frequencies of two filters are close to each other, out-of-band attenuation is degraded due to electromagnetic coupling of the two filters. Accordingly, it is difficult to both secure out-of-band attenuation and achieve a reduction in size.

The term "center frequency" is defined as the arithmetic mean of the lower side cutoff frequency and the higher side cutoff frequency in a band stop filter and the arithmetic mean of the lower side pass frequency and the higher side pass frequency in a band pass filter.

SUMMARY OF THE INVENTION

Accordingly, preferred embodiments of the present invention provide an elastic wave device that is capable of having a reduced size while achieving significantly improved isolation characteristics and out-of-band attenuation, despite piezoelectric substrates thereof being arranged so as to face each other across a cavity.

According to a preferred embodiment of the present invention, an elastic wave device includes a first piezoelectric substrate, a second piezoelectric substrate, a joining portion that joins the first piezoelectric substrate and the second piezoelectric substrate to each other such that the first piezoelectric substrate and the second piezoelectric substrate face each other and a cavity is provided between the first piezoelectric substrate and the second piezoelectric substrate, a first set of a plurality of filters located on one main surface of the first piezoelectric substrate, which faces the second piezoelectric substrate across the cavity, and a second set of a plurality of filters located on one main surface of the second piezoelectric substrate, which faces the first piezoelectric substrate across the cavity. The first set of filters and the second set of filters define a plurality of pairs of filters and face each other across the cavity. An absolute value of a difference between center frequencies of a filter of the first set of filters and a filter of the second set of filters in each pair of filters is larger than a minimum value among absolute values of differences between center frequencies of pairs of filters selected from a group including the first set of filters and the second set of filters.

With the above-described configuration, among pairs of filters in which the first set of filters and the second set of filters face each other across the cavity, a combination in which the absolute value of the difference between center frequencies of a filter of the first set of filters and a filter of the second set of filters is the minimum is eliminated. That is, a combination of filters having center frequencies that are closest to each other does not face each other. Thus, filters having center frequencies that are close to each other can be arranged so as to be spatially separated from each other, electromagnetic coupling between the filters is significantly reduced and prevented, and along with it being possible to improve out-of-band attenuation and isolation, size reduction and a configuration applicable to a multi-band filter can be realized.

It is preferable that, among combinations, in which the first set of filters and the second set of filters define a plurality of pairs and face each other across a cavity, a combination, in which the minimum value of absolute values of differences between the center frequencies of the filters of the first set of filters and the filters of the second set of filters in the plurality of pairs of filters is maximized, is selected.

In this case, it is possible to make the absolute value of the difference between the center frequencies of a first filter and a second filter, which face each other across the cavity, as large as possible, and therefore out-of-band attenuation and isolation can be further improved.

According to a preferred embodiment of the present invention, the first set of filters and the second set of filters preferably are reception filters and transmission filters of at least two bands.

In this case, the elastic wave device is a multi-band duplexer.

It is preferable that the elastic wave device further include a connection member that is joined to the first piezoelectric substrate and the second piezoelectric substrate, possesses conductivity, is electrically connected to ground, and is arranged inside the cavity between regions in which filters of the first set and filters of the second set, which define pairs, face each other.

In this case, as a result of providing a ground via the connection member, electromagnetic coupling between the different pairs of filters arranged on either side of the connection member is significantly reduced and prevented. As a result, out-of-band attenuation and isolation can be further improved. In addition, heat is transmitted through the connection member and as a result the effect of dissipating heat caused by self-heating of the filters that occurs when electricity is applied to the filters can be improved and deterioration of the power handling capability that occurs with integration of elements can be significantly reduced and prevented. Furthermore, a space can be secured between the first and second piezoelectric substrates by the connection member and therefore the strength of the elastic wave device can be improved.

It is preferable that the joining portion and the connection member be made of the same material.

In this case, the joining portion and the connection member are preferably made of the same material and as a result the manufacturing cost can be reduced.

It is preferable that the thickness of the second piezoelectric substrate be smaller than the thickness of the first substrate. In each pair of a filter of the first set of filters and a filter of the second set of filters, the center frequency of the filter of the second set of filters is preferably higher than the center frequency of the filter of the first set of filters.

In this case, a filter having a relatively high center frequency is arranged on the relatively thin second piezoelectric substrate such that an unwanted response due to bulk waves can be effectively prevented.

An elastic wave device according to a preferred embodiment of the present invention is capable of being of a reduced size while having improved isolation characteristics and out-of-band attenuation, despite piezoelectric substrates thereof being arranged so as to face each other across a cavity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described while referring to FIG. 1 and FIG. 2.

Preferred Embodiment 1-1

An elastic wave device 10 of preferred embodiment 1-1 will be described while referring to the sectional view of FIG. 1.

Figure 1:
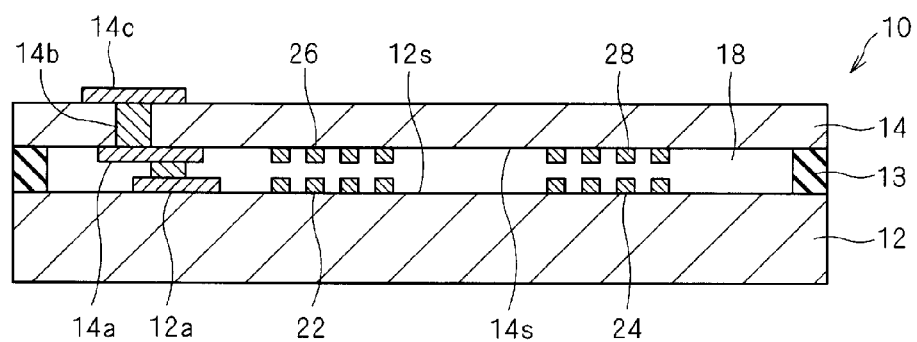
FIG. 1 is a sectional view of an elastic wave device according to a preferred embodiment of the present invention.

As illustrated in FIG. 1, in the elastic wave device 10, a first piezoelectric substrate 12 and a second piezoelectric substrate 14 are joined to each other with a joining portion 13 such that the first piezoelectric substrate 12 and the second piezoelectric substrate 14 face each other and a cavity 18 is provided between the first piezoelectric substrate 12 and the second piezoelectric substrate 14.

A first filter 22 (also referred to as "filter 1"), a second filter 24 (also referred to as "filter 2") and a connection electrode 12a are located on one main surface (also referred to as "facing surface") 12s of the first piezoelectric substrate 12, the facing surface 12s facing the second piezoelectric substrate 14 across the cavity 18.

A third filter 26 (also referred to as "filter 3"), a fourth filter 28 (also referred to as "filter 4") and a connection electrode 14a are located on one main surface (also referred to as "facing surface") 14s of the second piezoelectric substrate 14, the facing surface 14s facing the first piezoelectric substrate 12 across the cavity 18.

The connection electrode 12a of the first piezoelectric substrate 12 and the connection electrode 14a of the second piezoelectric substrate 14 are electrically connected to each other through a bump or other suitable connection member.

In the second piezoelectric substrate 14, a via hole conductor 14b penetrates through the second piezoelectric substrate 14. One end of the via hole conductor 14b is connected to the connection electrode 14a. On the other surface of the second piezoelectric substrate 14, a terminal electrode 14c that is exposed to the outside is located. The terminal electrode 14c is connected to the other end of the via hole conductor 14b The first piezoelectric substrate 12 and the second piezoelectric substrate 14 are preferably made of a piezoelectric material such as lithium tantalate ($LiTaO_3$), or lithium niobate ($LiNbO_3$). The joining portion 13 preferably includes a solder alloy, a resin or other suitable material.

The first and second filters 22 and 24 located on the facing surface 12s of the first piezoelectric substrate 12 and the third and fourth filters 26 and 28 located on the facing surface 14s of the second piezoelectric substrate 14 are filters that include a comb-shaped IDT electrodes that excite elastic waves such as surface acoustic waves (SAWs) or boundary waves.

The first and second filters 22 and 24 located on the facing surface 12s of the first piezoelectric substrate 12 define a first set of filters. The third and fourth filters 26 and 28 located on the facing surface 14s of the second piezoelectric substrate 14 define a second set of filters.

The first filter 22 and the third filter 26 define a first pair and face each other across the cavity 18. The second filter 24 and the fourth filter 28 define a second pair and face each other across the cavity 18.

If the center frequencies of the first to fourth filters 22, 24, 26 and 28 (filters 1 to 4) are denoted by f1, f2, f3 and f4, the absolute value of the difference between the center frequencies of the first pair of filters is |f1−f3| and the absolute value of the difference between the center frequencies of the second pair of filters is |f2−f4|.

In preferred embodiment 1-1, as for the center frequencies f1 to f4 of the filters 1 to 4, the absolute values of the differences between the central frequencies of the pairs of filters |f1−f3| and |f2−f4| are each preferably made to be larger than the minimum value among absolute values of differences between the center frequencies of pairs of filters selected from a group including the first set of filters and the second set of filters (that is, the filters 1 to 4).

Taking a GSM four-wavelength quad-band filter as an example (center frequencies: 850 MHz, 900 MHz, 1800 MHz, 1900 MHz), the center frequencies f1 to f4 of the filters 1 to 4 are selected from among any combinations illustrated in the below Table 1-1 except for cases 5 and 6 which include 50 MHz which is the minimum value among the absolute values of the differences between pairs of filters selected from a group including filters having central frequencies of 850 MHz, 900 MHz, 1800 MHz and 1900 MHz, that is, any of cases 1 to 4.

TABLE 1-1

(Units: MHz)

| Case | Filter 1 | Filter 2 | Filter 3 | Filter 4 | Difference between frequencies of filters 1 and 3 | Difference between frequencies of filters 2 and 4 | Judgment |
|---|---|---|---|---|---|---|---|
| 1 | 850 | 900 | 1800 | 1900 | 950 | 1000 | ○ |
| 2 | 850 | 900 | 1900 | 1800 | 1050 | 900 | ○ |
| 3 | 850 | 1900 | 1800 | 900 | 950 | 1000 | ○ |
| 4 | 850 | 1800 | 1900 | 900 | 1050 | 900 | ○ |
| 5 | 850 | 1800 | 900 | 1900 | 50 | 100 | X |
| 6 | 850 | 1900 | 900 | 1800 | 50 | 100 | X |

In the table, "O" indicates cases that can be selected in preferred embodiment 1-1. In the table "X" indicates cases that cannot be selected in preferred embodiment 1-1.

In this way, the elastic wave filter device 10 including the plurality of filters 22, 24, 26 and 28 can be reduced in size. Alternatively, a greater number of filters can be incorporated into a package of the same size such that an elastic wave device appropriate for a greater number of bands can be provided, which can contribute to a decrease in cost due to the reduction in the number of components and the mounting surface area.

Although the filters 22 and 26 and the filters 24 and 28, which face each other across the cavity 18, are very close to each other spatially and therefore electromagnetic coupling therebetween is liable to become strong, if the center frequencies are spaced apart from each other to a greater degree than in cases 5 and 6, as in cases 1 to 4 in Table 1-1, the electromagnetic coupling is significantly reduced and prevented, and therefore out-of-band attenuation can be improved.

The larger the absolute value of the difference between the center frequencies of filters of a pair are, the weaker the electromagnetic coupling between the filters of a pair becomes and therefore, among cases 1 to 4 in Table 1-1, case 1 and case 3, which are combinations in which the minimum values of the absolute values of the differences between the center frequencies of the filters of the pairs (950 MHz in case 1, 900 MHz in case 2, 950 MHz in case 3 and 900 MHz in case 4) are maximum, are preferable and out-of-band attenuation and isolation can be improved more over in case 2 and case 4.

Preferred Embodiment 1-2

Preferred embodiment 1-2 preferably has substantially the same configuration as the elastic wave device 10 of preferred embodiment 1-1. Hereafter, description focusing on the points of difference will be made while referring to FIG. 1.

In preferred embodiment 1-2, as illustrated in FIG. 1, the thickness of the second piezoelectric substrate 14 is smaller than the thickness of the first piezoelectric substrate 12.

As for the center frequencies f1 to f4 of the first to fourth filters 22, 24, 26, and 28 (filters 1 to 4), similarly to as in preferred embodiment 1-1, the absolute values of the differences between the central frequencies of the pairs of filters facing each other across the cavity 18 |f1−f3| and |f2−f4| are each preferably made to be larger than the minimum value among absolute values of the differences between the center frequencies of pairs of filters selected from a group including the first set of filters and the second set of filters (that is, the filters 1 to 4).

In preferred embodiment 1-2, as well as satisfying the same conditions as in the above-described preferred embodiment 1-1, the center frequencies of the second set of filters 26 and 28 formed on the facing surface 14s of the relatively thin second piezoelectric substrate 14 are preferably made to be higher than the center frequencies of the first set of filters 22 and 24 located on the facing surface 12s of the relatively thick first piezoelectric substrate 12. That is, combinations are selected such that the center frequency of the filter 3 is higher than the center frequency of the filter 1 in the first pair and the center frequency of the filter 4 is higher than the center frequency of the filter 2 in the second pair.

For example, taking a GSM four-wavelength quad-band filter (center frequencies: 850 MHz, 900 MHz, 1800 MHz and 1900 MHz), the same as in preferred embodiment 1-1, as an example, as illustrated in the following Table 1-2, the center frequencies f1 to f4 of the filters 1 to 4 are selected as case 1 or 2 in which the center frequency of the filter 3 is higher than the center frequency of the filter 1 and the center frequency of the filter 4 is higher than the center frequency of the filter 2 from among cases 1 to 4. Cases 5 and 6, which include 50 MHz which is the minimum value among absolute values of differences between center frequencies of pairs of filters, are excluded.

TABLE 1-2

(Units: MHz)

| Case | Filter 1 | Filter 2 | Filter 3 | Filter 4 | Difference between frequencies of filters 1 and 3 | Difference between frequencies of filters 2 and 4 | Judgment |
|---|---|---|---|---|---|---|---|
| 1 | 850 | 900 | 1800 | 1900 | 950 | 1000 | ○ |
| 2 | 850 | 900 | 1900 | 1800 | 1050 | 900 | ○ |
| 3 | 850 | 1900 | 1800 | 900 | 950 | 1000 | X |
| 4 | 850 | 1800 | 1900 | 900 | 1050 | 900 | X |
| 5 | 850 | 1800 | 900 | 1900 | 50 | 100 | X |
| 6 | 850 | 1900 | 900 | 1800 | 50 | 100 | X |

In the table, "O" indicates cases that can be selected in preferred embodiment 1-2. In the table, "X" indicates cases that cannot be selected in preferred embodiment 1-2.

The smaller the thickness of a piezoelectric substrate, which has been normalized using the IDT electrode pitch, is, the larger an unwanted response due to bulk waves radiated in the depth direction of a piezoelectric substrate among elastic waves excited by an IDT electrode becomes. In each pair of facing filters, an unwanted response due to bulk waves can be effectively prevented by arranging the second set of filters 26 and 28, which have center frequencies that are higher than those of the first set of filters 22 and 24 located on the facing surface 12s of the relatively thick first piezoelectric substrate 12, on the facing surface 14s of the relatively thin second piezoelectric substrate 14.

Preferred Embodiment 2-1

Preferred embodiment 2-1 is a two-band dual duplexer (DPX) including the four filters 22, 24, 26 and 28 (filters 1 to 4) described in preferred embodiment 1-1. The filters 22, 24, 26 and 28 located on the facing surfaces 12s and 14s of the first and second piezoelectric substrates 12 and 14 are arranged such that transmission (Tx) filters and reception (Rx) filters having different bands face each other.

For example, in the case of a Band 2-Band 8 dual DPX, the center frequencies of the bands Tx and Rx are:
Band 2 Tx: 1880 MHz,
Band 2 Rx: 1960 MHz,
Band 8 Tx: 897.5 MHz, and
Band 8 Rx: 942.5 MHz.

In this case, the center frequencies f1 to f4 of the filters 1 to 4 are selected from among any of the combinations illustrated in the following Table 2-1 except cases 5 and 6, which include 45 MHz which is the minimum value among absolute values of the differences between the center frequencies of pairs of filters selected from a group including filters of 1880 MHz, 1960 MHz, 897.5 MHz and 942.5 MHz, that is, are selected from among cases 1 to 4.

filters is significantly reduced and prevented and isolation characteristics can be significantly improved.

The larger the absolute value of the difference between the center frequencies of filters of a pair is, the weaker the electromagnetic coupling between the filters of the pair becomes and therefore, among cases 1 to 4 in Table 2-1, case 1 and case 3, which are combinations in which the minimum value of the absolute value of the difference between the center frequencies of the filters of each pair (982.5 MHz in case 1, 937.5 MHz in case 2, 982.5 MHz in case 3 and 937.5 MHz in case 4) is maximum, are preferable over in case 2 and case 4 and out-of-band attenuation and isolation can be improved more.

Preferred Embodiment 2-2

Preferred embodiment 2-2 preferably has substantially the same configuration as the DPX of preferred embodiment 2-1. Hereafter, description focusing on the points of difference will be made while referring to FIG. 1.

In preferred embodiment 2-2, as illustrated in FIG. 1, the thickness of the second piezoelectric substrate 14 is smaller than the thickness of the first piezoelectric substrate 12.

As for the center frequencies f1 to f4 of the first to fourth filters 22, 24, 26, and 28 (filters 1 to 4), similarly to as in preferred embodiment 2-1, the absolute values of the differences between the central frequencies of the filters of each pair facing each other across the cavity 18 |f1−f3| and |f2−f4| are preferably larger than the minimum value among absolute values of the differences between the center frequencies of pairs of filters selected from the group including the first set of filters and the second set of filters (that is, the filters 1 to 4).

In preferred embodiment 2-2, as well as satisfying the same conditions as in the above-described preferred embodiment 2-1, the center frequencies of the second set of filters 26 and 28 located on the facing surface 14s of the relatively thin second piezoelectric substrate 14 are preferably made to be higher than the center frequencies of the first set of filters 22 and 24 located on the facing surface 12s of the relatively thick first piezoelectric substrate 12. That is, combinations are

TABLE 2-1

(Units: MHz)

| Case | Filter 1 | Filter 2 | Filter 3 | Filter 4 | Difference between frequencies of filters 1 and 3 | Difference between frequencies of filters 2 and 4 | Judgment |
|---|---|---|---|---|---|---|---|
| 1 | Band 8 Tx | Band 8 Rx | Band 2 Tx | Band 2 Rx | 982.5 | 1017.5 | O |
| 2 | Band 8 Tx | Band 8 Rx | Band 2 Rx | Band 2 Tx | 1062.5 | 937.5 | O |
| 3 | Band 8 Tx | Band 2 Rx | Band 2 Tx | Band 8 Rx | 982.5 | 1017.5 | O |
| 4 | Band 8 Tx | Band 2 Tx | Band 2 Rx | Band 8 Rx | 1062.5 | 937.5 | O |
| 5 | Band 8 Tx | Band 2 Tx | Band 8 Rx | Band 2 Rx | 45 | 80 | X |
| 6 | Band 8 Tx | Band 2 Rx | Band 8 Rx | Band 2 Tx | 45 | 80 | X |

In the table, "0" indicates cases that can be selected in preferred embodiment 2-1. In the table, "X" indicates cases that cannot be selected in preferred embodiment 2-1.

Preferred embodiment 2-1 is similar to preferred embodiment 1-1 and filters having center frequencies that are close to each other are arranged so as not to face each other across the cavity 18 such that electromagnetic coupling between the selected such that the center frequency of the filter 3 is higher than the center frequency of the filter 1 in the first pair and the center frequency of the filter 4 is higher than the center frequency of the filter 2 in the second pair.

For example, taking a Band 2-Band 8 duplexer DPX, the same as in preferred embodiment 2-1, as an example, the center frequencies f1 to f4 of the filters 1 to 4 are selected as cases 1 or 2 in which the center frequency of the filter 3 is higher than the center frequency of the filter 1 and the center frequency of the filter 4 is higher than the center frequency of the filter 2 among cases 1 to 4, as illustrated in the following Table 2-2. Cases 5 and 6, which include 45 MHz which is the minimum value among absolute values of differences between the center frequencies of pairs of filters, are excluded.

TABLE 2-2

(Units: MHz)

| Case | Filter 1 | Filter 2 | Filter 3 | Filter 4 | Difference between frequencies of filters 1 and 3 | Difference between frequencies of filters 2 and 4 | Judgment |
|---|---|---|---|---|---|---|---|
| 1 | Band 8 Tx | Band 8 Rx | Band 2 Tx | Band 2 Rx | 982.5 | 1017.5 | ◯ |
| 2 | Band 8 Tx | Band 8 Rx | Band 2 Rx | Band 2 Tx | 1062.5 | 937.5 | ◯ |
| 3 | Band 8 Tx | Band 2 Rx | Band 2 Tx | Band 8 Rx | 982.5 | 1017.5 | X |
| 4 | Band 8 Tx | Band 2 Tx | Band 2 Rx | Band 8 Rx | 1062.5 | 937.5 | X |
| 5 | Band 8 Tx | Band 2 Tx | Band 8 Rx | Band 2 Rx | 45 | 80 | X |
| 6 | Band 8 Tx | Band 2 Rx | Band 8 Rx | Band 2 Tx | 45 | 80 | X |

In the table, "◯" indicates cases that can be selected in preferred embodiment 2-2. In the table "X" indicates cases that cannot be selected in preferred embodiment 2-2.

The smaller the thickness of a piezoelectric substrate, which has been normalized using the IDT electrode pitch, is, the larger an unwanted response due to bulk waves radiated in the depth direction of the piezoelectric substrate among elastic waves excited by the IDT electrode becomes. In each pair of facing filters, an unwanted response due to bulk waves can be effectively prevented by arranging the second set of filters 26 and 28, which have center frequencies that are higher than those of the first set of filters 22 and 24 located on the facing surface 12s of the relatively thick first piezoelectric substrate 12, on the facing surface 14s of the relatively thin second piezoelectric substrate 14.

Preferred Embodiment 3

An elastic wave device 10a of preferred embodiment 3 will be described with reference to the sectional view of FIG. 2.

Figure 2:
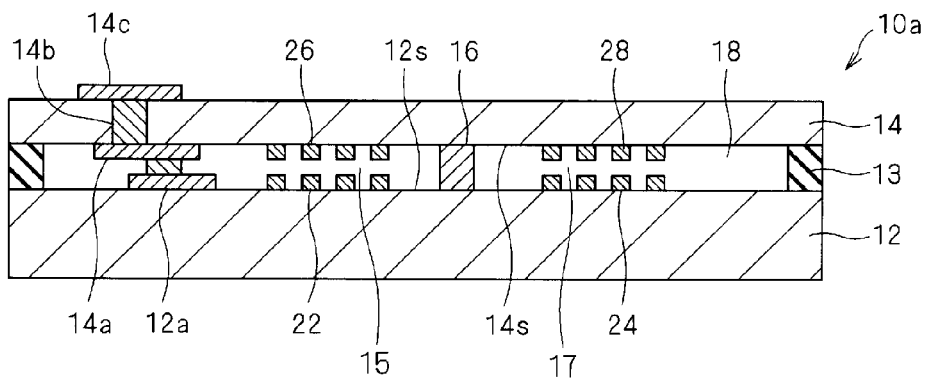
FIG. 2 is a sectional view of an elastic wave device according to a preferred embodiment of the present invention.
Figure 3:
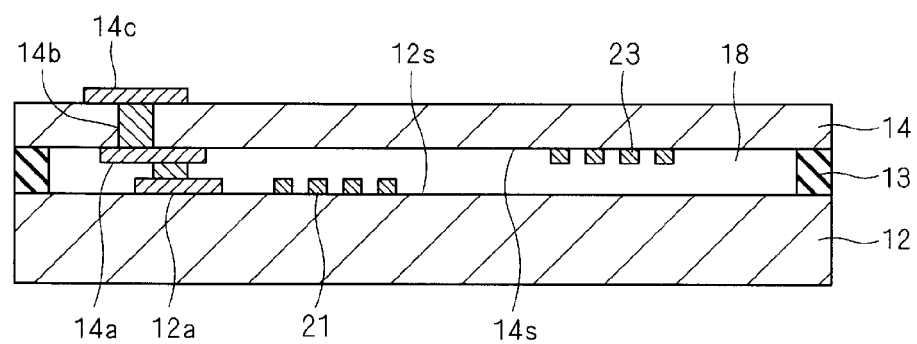
FIG. 3 is a sectional view of an elastic wave device according to a comparative example.
Figure 4:
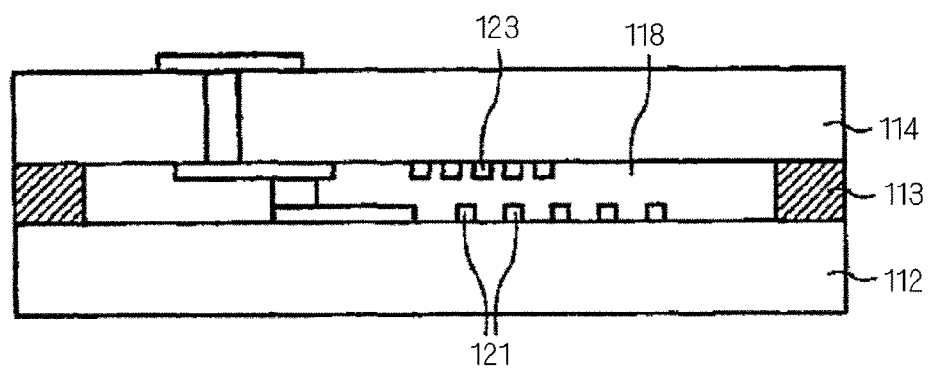
FIG. 4 is a sectional view of a conventional elastic wave device.

As illustrated in FIG. 2, in the elastic wave device 10a of preferred embodiment 3, the structure of the elastic wave device 10 of preferred embodiment 1-1 further includes a connection member 16.

The connection member 16 preferably is a metal structural member that has a columnar shape or a wall-like shape, is joined to the facing surface 12s of the first piezoelectric substrate 12 and the facing surface 14s of the second piezoelectric substrate 14, and has conductivity. The connection member 16 is arranged in the cavity 18, which is between the first piezoelectric substrate 12 and the second piezoelectric substrate 14, between a region 15 in which the first pair of filters 22 and 26 face each other and a region 17 in which the second pair of filters 24 and 28 face each other. Although not illustrated, the connection member 16 is electrically connected to a ground electrode via a wiring pattern or a via hole conductor.

If the connection conductor 16 is made of the same material as the joining portion 13 (for example, a solder alloy or a conductive paste), the manufacturing cost can be desirably reduced.

With the elastic wave device 10a of preferred embodiment 3, similarly to as in preferred embodiment 1-1, isolation characteristics and out-of-band attenuation can be improved, even though the device is of a reduced size.

In the elastic wave device 10a of preferred embodiment 3, the connection member 16, which is arranged between the region 15 in which the first pair of filters 22 and 26 face each other and the region 17 in which the second pair of filters 24 and 28 face each other, serves as a shield electrode and electromagnetic coupling between the first pair of filters 22 and 26 and the second pair of filters 24 and 28 is significantly reduced and prevented. As a result, out-of-band attenuation and isolation can be further improved.

The connection member 16 serves as a heat-radiating path and heat generated due to electricity being applied to the filters 22, 24, 26 and 28 can be readily released and therefore increases in temperature of the filters 22, 24, 26 and 28 when electricity is applied can be significantly reduced and prevented. Thus, deterioration of power handling capability that occurs with integration of elements can be significantly reduced and prevented.

As a result of providing the connection member 16, a space can be secured in a portion in which the first and second piezoelectric substrates 12 and 14 face each other across the cavity 18 and therefore the strength of the elastic wave device 10a is improved. Thus, for example, the capability of the elastic wave device 10a to withstand molding is improved.

Furthermore, the connection member 16 is preferably able to act as a shield (divider) in the cavity 18 between the cavities 15 and 17 along the entirety of the depth direction of the plane of the paper (FIG. 2). However, it can be even structured in the shape of a supporting column that is connected to portions of the facing surfaces 12s and 14s such that improvements in a certain shielding effect and capability of withstanding molding can be expected.

According to various preferred embodiments of the present invention, in filters located on facing surfaces of piezoelectric substrates which face each other across a cavity, the center frequency of each filter is decided upon by focusing upon the absolute value of the difference between the center frequencies of the filters facing each other across the cavity, whereby out-of-band attenuation of a multi- (quad-) band filter can be improved and isolation characteristics of a dual-band duplexer can be improved.

The present invention is not limited to the above-described preferred embodiments and can be modified in various ways.

For example, the present invention is not limited to a case in which band pass filters are located on first and second piezoelectric substrates and can also be applied to a case in which band stop filters are located on first and second piezoelectric substrates. In addition, the present invention can also be applied to multi-band filters, which have a greater number of bands than a quadband filter, and to multi-band duplexers, which have a greater number of bands than a dual band duplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a first piezoelectric substrate;
a second piezoelectric substrate;
a joining portion that joins the first piezoelectric substrate and the second piezoelectric substrate to each other such that the first piezoelectric substrate and the second piezoelectric substrate face each other and a cavity is provided between the first piezoelectric substrate and the second piezoelectric substrate;
a first set of a plurality of filters located on one main surface of the first piezoelectric substrate, which faces the second piezoelectric substrate across the cavity;
a second set of a plurality of filters located on one main surface of the second piezoelectric substrate, which faces the first piezoelectric substrate across the cavity; wherein
the first set of filters and the second set of filters define a plurality of pairs of filters and face each other across the cavity; and
each of absolute values of differences between center frequencies of filters of the first set of filters and filters of the second set of filters of each pair of filters is larger than a minimum value among absolute values of differences between center frequencies of pairs of filters selected from a group including the first set of filters and the second set of filters.

2. The elastic wave device according to claim 1, wherein the first set of filters and the second set of filters define a plurality of pairs of filters and face each other across the cavity such that the minimum value of absolute values of differences between the center frequencies of the filters of the first set of filters and the filters of the second set of filters in the plurality of pairs of filters is maximized.

3. The elastic wave device according to claim 1, wherein the first set of filters and the second set of filters are reception filters and transmission filters of at least two bands.

4. The elastic wave device according to claim 1, further comprising a connection member that is joined to the first piezoelectric substrate and the second piezoelectric substrate, possesses conductivity, is electrically connected to ground, and is arranged inside the cavity between regions in which filters of the first set and filters of the second set, which define pairs, face each other.

5. The elastic wave device according to claim 4, wherein the joining portion and the connection member are made of the same material.

6. The elastic wave device according to claim 1, wherein a thickness of the second piezoelectric substrate is smaller than a thickness of the first substrate and in each pair of a filter of the first set of filters and a filter of the second set of filters, the center frequency of the filter of the second set of filters is higher than the center frequency of the filter of the first set of filters.

* * * * *